（12）United States Patent
Suh et al.

(10) Patent No.: US 7,771,843 B2
(45) Date of Patent: Aug. 10, 2010

(54) ORGANIC LIGHT-EMITTING DEVICE EMPLOYING DOPED HOLE TRANSPORTING LAYER AND/OR HOLE INJECTING LAYER

(75) Inventors: Min Chul Suh, Seongnam-si (KR); Nam-Choul Yang, Seoul (KR); Byung-Doo Chin, Seongnam-si (KR); Mu-Hyun Kim, Suwon-si (KR); Seong-Taek Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 10/839,338

(22) Filed: May 6, 2004

(65) Prior Publication Data
US 2004/0265630 A1 Dec. 30, 2004

(30) Foreign Application Priority Data
Jun. 24, 2003 (KR) .................. 10-2003-0041250

(51) Int. Cl.
H01J 1/62 (2006.01)
H05B 33/12 (2006.01)

(52) U.S. Cl. ................. 428/690; 428/917; 313/504; 313/506

(58) Field of Classification Search ................. 428/690, 428/917; 313/504, 506; 257/E51.043, E51.048, 257/40; 252/301.16; 427/66
See application file for complete search history.

(56) References Cited

U.S. PATENT DOCUMENTS

| 4,356,429 A | 10/1982 | Tang ............................ 313/503 |
| 4,539,507 A | 9/1985 | VanSlyke et al. ............. 313/504 |
| 4,720,432 A | 1/1988 | VanSlyke et al. ............. 428/457 |
| 4,769,292 A | 9/1988 | Tang et al. ................... 428/690 |
| 5,093,698 A | 3/1992 | Egusa .......................... 257/40 |
| 5,220,348 A | 6/1993 | D'Aurelio .................... 347/236 |
| 5,247,190 A | 9/1993 | Friend et al. .................. 257/40 |
| 5,256,506 A | 10/1993 | Ellis et al. ..................... 430/20 |
| 5,278,023 A | 1/1994 | Bills et al. ................... 430/201 |
| 5,308,737 A | 5/1994 | Bills et al. ................... 430/201 |
| 5,601,903 A | 2/1997 | Fujii et al. |

(Continued)

FOREIGN PATENT DOCUMENTS

CN 1236289 11/1999

(Continued)

OTHER PUBLICATIONS

U.S. Appl. No. 10/757,471, filed Aug. 2004, Suh.*

(Continued)

*Primary Examiner*—D. Lawrence Tarazano
*Assistant Examiner*—Camie S Thompson
(74) *Attorney, Agent, or Firm*—Stein McEwen, LLP

(57) ABSTRACT

An organic light-emitting device including an anode, a cathode, an emission layer interposed between the anode and the cathode, and at least one of the hole injecting layer and the hole transporting layer interposed between the anode and the emission layer, wherein the at least one of the hole injecting layer and the hole transporting layer includes a host material, and a dopant material as an electron acceptor, wherein the dopant material has an electron affinity greater than that of the host material by at least 0.1 eV.

24 Claims, 1 Drawing Sheet

U.S. PATENT DOCUMENTS

| | | | |
|---|---|---|---|
| 5,807,627 A | 9/1998 | Friend et al. | 428/212 |
| 5,998,085 A | 12/1999 | Isberg et al. | 430/200 |
| 6,087,196 A | 7/2000 | Sturm et al. | 438/29 |
| 6,097,141 A * | 8/2000 | Jeong et al. | 313/385 |
| 6,358,633 B1 * | 3/2002 | Sano et al. | 428/690 |
| 6,423,429 B2 | 7/2002 | Kido et al. | 428/690 |
| 6,566,807 B1 | 5/2003 | Fujita et al. | 313/506 |
| 6,589,673 B1 | 7/2003 | Kido et al. | 428/690 |
| 7,141,817 B2 * | 11/2006 | Nishi et al. | 257/40 |
| 7,199,516 B2 * | 4/2007 | Seo et al. | 313/504 |
| 2002/0038867 A1 | 4/2002 | Kobori et al. | 257/40 |
| 2004/0146744 A1 | 7/2004 | Seo et al. | 428/690 |
| 2004/0150330 A1 * | 8/2004 | Suh | 313/506 |
| 2005/0142384 A1 * | 6/2005 | Itai | 428/690 |

FOREIGN PATENT DOCUMENTS

| | | |
|---|---|---|
| CN | 1290119 | 4/2001 |
| CN | 1362746 | 8/2002 |
| CN | 1422104 | 6/2003 |
| EP | 1017118 | 7/2000 |
| JP | 10-153967 | 6/1998 |
| JP | 2000-150169 * | 5/2000 |
| JP | 2000-196140 | 7/2000 |
| KR | 1998-26046 | 7/1998 |
| KR | 1998-51814 | 9/1998 |
| KR | 2000-64839 | 11/2000 |
| WO | WO 98/24271 | 6/1998 |
| WO | WO 01/67825 | 9/2001 |
| WO | WO 2004/091262 | 10/2004 |

OTHER PUBLICATIONS

Office Action issue in Korean Patent Application No. 2003-41250 on Jun. 28, 2005.

English Abstract of Publication No. 100441512.

Blockwitz, J. et al. "Low voltage organic light emitting diodes featuring doped phthalocyanine as hole transport material." *Applied Physics Letters*. vol. 73, No. 6, Aug. 10, 1998, p. 729-731.

Huang, Jinsong et al. "Low-voltage organic electroluminescent devices using *pin* structures." *Applied Physics Letters*. vol. 80, No. 1. Jan. 7, 2002, p. 139-141.

Chinese Office Action issued on Sep. 21, 2007, in Chinese Patent Application No. 2004100493946 (in Chinese with English translation).

J. Kanicki et al., "Organic Polymer Light-Emitting Devices on a Flexible Plastic Substrate," *IMID '04 Digest*, Aug. 23, 2004, pp. 91-94 (numbered as pp. 1-4) (*Asia Display/IMID '04 Digest of Technical Papers*, proceedings of the 24th International Display Research Conference in conjunction with the 4th International Meeting on Information Display, Daegu, Republic of Korea, Aug. 23-27, 2004).

Y. Hong et al., "Opto-Electronic Properties of Poly (Fluorene) Co-Polymer Red Light-Emitting Devices on Flexible Plastic Substrate," *IEEE Transactions on Electron Device*, vol. 51, No. 10, Oct. 2004, pp. 1562-1569.

U.S. Appl. No. 10/757,471, filed Jan. 15, 2004, Min-Chul Suh, Samsung Mobile Display Co., Ltd.

Korean Office Action issued on Apr. 15, 2005, in Korean Application No. 2003-6617 (5 pages, in Korean, no English translation).

Chinese Office Action issued on Sep. 28, 2007, in Chinese Application No. 2004100387542 (15 pages, in Chinese, with complete English translation).

Chinese Office Action dated Dec. 18, 2009, issued in corresponding Chinese Patent Application No. 2004100493946.

* cited by examiner

ORGANIC LIGHT-EMITTING DEVICE EMPLOYING DOPED HOLE TRANSPORTING LAYER AND/OR HOLE INJECTING LAYER

CROSS-REFERENCE TO RELATED APPLICATIONS

This application claims the benefit of Korean Patent Application No. 2003-41250, filed Jun. 24, 2003, in the Korean Intellectual Property Office, the disclosure of which is incorporated herein by reference.

BACKGROUND OF THE INVENTION

1. Field of the Invention

The present invention relates to an organic light-emitting device (OLED), and, more particularly, to an organic light-emitting device having a doped hole transporting layer (HTL) and/or a hole injecting layer (HIL).

2. Description of the Related Art

An organic light-emitting device, such as a self-emissive display, has an ideal structure in that it is compact and lightweight and has simple components and processes. The OLED also has several other advantages, such as the capability to secure high definition and a wide viewing angle, the capability to realize a superb moving picture and a high contrast, and an electrical characteristic suitable for a mobile device due to a driving capability requiring low power consumption and low voltage.

As for the general structure of the organic light-emitting device, an anode is located on a substrate. An organic layer, including an emission layer (EML), is located on the anode. A cathode is located on the organic layer. The organic layer may further include a hole injecting layer (HIL) and/or a hole transporting layer (HTL) between the anode and the emission layer, as well as an electron transporting layer (ETL) and/or an electron injecting layer (EIL) between the emission layer and the cathode.

The organic light-emitting device has a driving principle as follows. When a voltage is applied between the anode and the cathode, holes are injected from the anode through the hole injecting layer and the hole transporting layer into the emission layer, while electrons are injected from the cathode through the electron injecting layer and the electron transporting layer into the emission layer. The holes and electrons, which are injected into the emission layer, are recombined at the emission layer, thus generating excitons. While being transited from an excited state to a ground state, these excitons emit light.

Generally, hole mobility in the organic layer is about 10 to 100 times as high as electron mobility. This has an influence on enhancement of luminous efficiency and improvement of lifetime of the device, both of which are needed to commercialize the organic light-emitting device.

In order to obtain a high luminous efficiency, equilibrium must be maintained between a quantity of the electrons injected into the emission layer and a quantity of the holes injected into the emission layer. However, as mentioned above, the hole mobility is higher than the electron mobility, and therefore the quantity of the holes injected into the emission layer becomes more than that of the electrons. In order to alleviate this problem, a hole blocking layer is additionally interposed between the emission layer and the electron transporting layer to confine the holes within the emission layer. Thereby, the luminous efficiency is enhanced.

Meanwhile, because work functions of each layer constituting the organic layer are different, charges are accumulated at each interface between the layers. Due to this charge accumulation, the organic light-emitting device becomes deteriorated. Thus, the lifetime of the organic light-emitting device becomes shortened. However, as described above, because the hole mobility is higher than the electron mobility, the holes accumulated at the interface between the emission layer and the hole injecting layer or the hole transporting layer and the anode are more than the electrons accumulated at the interface between the cathode and the electron injecting layer or the electron transporting layer and the emission layer.

To improve the situation created by this charge accumulation, according to U.S. Pat. No. 5,601,903, an emission layer or a charge transporting layer adjacent to a hole injecting electrode is doped with a material which has a conduction band lower than that of the emission layer or the charge transporting layer, and the emission layer or the charge transporting layer adjacent to an electron injecting electrode is doped with another material which has a valence band lower than that of the emission layer or charge transporting layer. Thereby, an energy barrier between the emission layer and the charge transporting layer is lowered to enhance the charge mobility, so that it is possible to lessen the problem of the charge accumulation. However, this facilitates the outflow of charges from the emission layer, so that it is possible to adversely influence the luminous efficiency.

SUMMARY OF THE INVENTION

Accordingly, the present invention has been made to solve the foregoing and/or other problems of the related art. An aspect of the present invention is to provide an organic light-emitting device capable of lowering hole mobility within a hole injecting layer and/or a hole transporting layer, thereby enhancing characteristics such as luminous efficiency, and extending the lifetime of the device.

Additional aspects and/or advantages of the invention will be set forth in part in the description which follows and, in part, will be obvious from the description, or may be learned by practice of the invention.

According to an aspect of the present invention, there is provided an organic light-emitting device comprising: an anode, a cathode, an emission layer interposed between the anode and the cathode; and at least one of a hole injecting layer (HIL) and a hole transporting layer (HTL) interposed between the anode and the emission layer, wherein the at least one of the hole injecting layer and the hole transporting layer comprises a host material, and a dopant material as an electron acceptor, wherein the dopant material has an electron affinity greater than that of the host material by at least 0.1 eV.

The electron acceptor may comprise at least one functional group selected from a group consisting of a nitro group (—$NO_2$), a cyano group (—CN), a sulfonyl group (—$SO_2$), a sulfoxide group (—$SO_3$), a carbonyl group (—CO), a carboxyl group (—$CO_2$), an ester group (—COO), an anhydride group, an imide group, an imine group, a halogen group, a fluoroalkyl group, and a fluoroaromatic group. Also, the electron acceptor may be one selected from a group consisting of an aromatic family, an olefin family, an aromatic-olefin conjugate family, an aromatic-aromatic conjugate family, a fused aromatic family, and a heterocyclic compound family.

The electron acceptor may be at least one selected from a group consisting of 4-nitroaniline, 4-nitrobiphenyl, 4-dimethylamino-4'-nitrostilbene, 1,4-dicyanobenzene, 9,10-dicyanoanthracene, 1,2,4,5-tetracyanobenzene, 3,4,9,10-perylenetetracarboxylic dianhydride, N,N'-bis(2,5-di-t- buytlphenyl)-3,4,9,10-perylenedicarboxyimide, tetrachlorophthalic anhydride, tetrachlorophthalonitrile, tetrafluoro-1,4-benzoquinone, naphthoquinone, anthraquinone, phenanthrenequinone, 1,10-phenanthroline-5,6-dione, phenazine, quinoxaline, and 2,3,6,7-tetrachloroquinoxaline.

The electron acceptor may have 0.01 to 50 wt % of the doped layer.

It is possible that the hole transporting layer is not doped with the electron acceptor.

A concentration of the electron acceptor doped into the at least one of the hole injecting layer and the hole transporting layer may decrease with a decreasing distance from the emission layer.

The organic light-emitting device may further comprise at least one selected from a group consisting of a hole blocking layer, an electron transporting layer, and an electron injecting layer, wherein the at least one selected from the group is interposed between the emission layer and the cathode.

The at least one of the hole injecting layer and the hole transporting layer may be formed using a solution process or a vacuum deposition.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
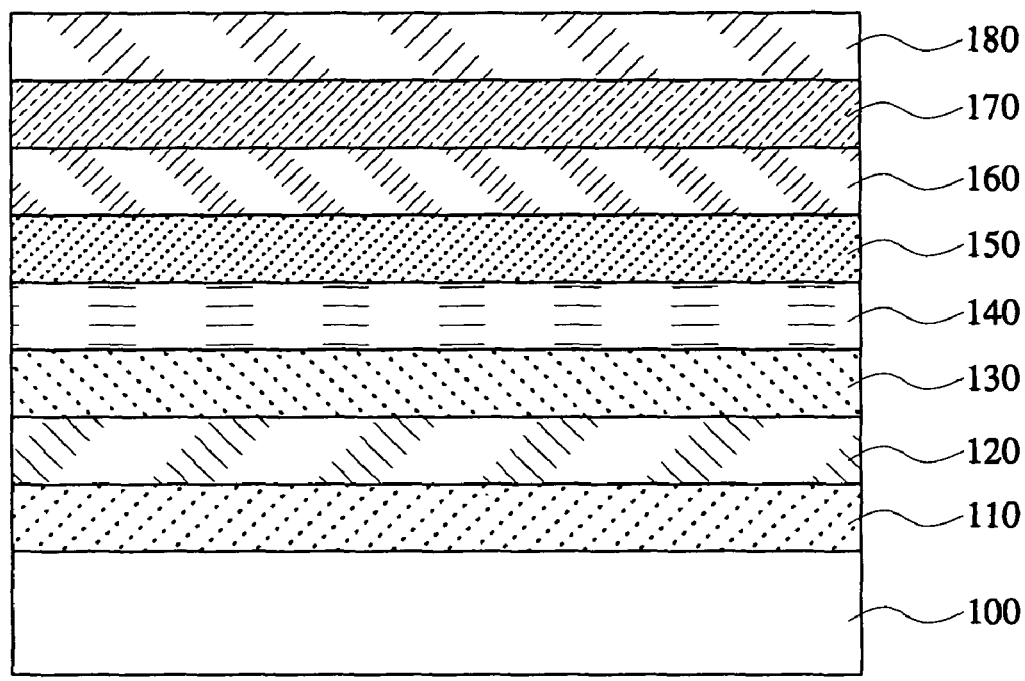
FIG. 1 is a cross-sectional view illustrating an organic light-emitting device according to an embodiment of the present invention, and a method of fabricating the same.

Reference will now be made in detail to the embodiments of the present invention, examples of which are illustrated in the accompanying drawings, wherein like reference numerals refer to the like elements throughout. The embodiments are described below to explain the present invention by referring to the figures.

In the description of the following embodiments of the present invention, when it is stated that a layer lies "on" another layer or a substrate, it means the layer may be formed directly on the other layer or the substrate, or another layer may be interposed between them. Throughout the specification, the same reference numerals represent the same components.

FIG. 1 is a cross-sectional view illustrating an organic light-emitting device according to an embodiment of the present invention, and a method of fabricating the same.

Referring to FIG. 1, an anode 110 is formed on a substrate 100. In the case of an active matrix organic light-emitting device, it includes a thin film transistor (TFT) (not shown), which is electrically connected with the anode 110 on the substrate 100. The anode 110 may be formed of a transparent electrode or a reflective electrode. When formed of a transparent electrode, the anode 110 is preferably, though not necessarily, formed using ITO (Indium Tin Oxide).

A hole injecting layer (HIL) 120 and a hole transporting layer (HTL) 130 are sequentially formed on the anode 110. Alternatively, either the hole injecting layer 120 or the hole transporting layer 130 may be formed on the anode 110. The hole injecting layer 120 and/or the hole transporting layer 130 contain a host material and a dopant material as an electron acceptor, where the dopant material has an electron affinity greater than that of the host material by 0.1 eV or more. Preferably, though not necessarily, of the hole injecting layer 120 and the hole transporting layer 130, only the hole injecting layer 120 is doped with the electron acceptor.

Preferably, though not necessarily, the electron acceptor has at least one functional group selected from a group consisting of a nitro group (—$NO_2$), a cyano group (—CN), a sulfonyl group (—$SO_2$), a sulfoxide group (—$SO_3$), a carbonyl group (—CO), a carboxyl group (—$CO_2$), an ester group (—COO), an anhydride group, an imide group, an imine group, a halogen group, a fluoroalkyl group and a fluoroaromatic group. More preferably, though not necessarily, the electron acceptor having said functional group is one selected from a group consisting of an aromatic family, an olefin family, an aromatic-olefin conjugate family, an aromatic-aromatic conjugate family, a fused aromatic family, and a heterocyclic compound family.

Preferably, though not necessarily, the electron acceptor is at least one selected from a group consisting of 4-nitroaniline, 4-nitrobiphenyl, 4-dimethylamino-4'-nitrostilbene, 1,4-dicyanobenzene, 9,10-dicyanoanthracene, 1,2,4,5-tetracyanobenzene, 3,4,9,10-perylenetetracarboxylic dianhydride, N,N'-bis(2,5-di-t-buytlphenyl)-3,4,9,10-perylenedicarboxyimide, tetrachlorophthalic anhydride, tetrachlorophthalonitrile, tetrafluoro-1,4-benzoquinone, naphthoquinone, anthraquinone, phenanthrenequinone, 1,10-phenanthroline-5,6-dione, phenazine, quinoxaline, and 2,3,6,7-tetrachloroquinoxaline. Most preferably, though again not necessarily, the electron acceptor is a material of 9,10-dicyanoanthracene.

In the hole transporting layer 130, preferably, though not necessarily, the host material is at least one selected from a group consisting of an aryl amine family and a starburst family, which consist of a low molecular material. Preferably, though not necessarily, the aryl amine family material is N,N'-Bis(naphthalen-1-yl)-N,N'-bis(phenyl)benzidine (hereinafter, referred to as "α-NPB"), and the starburst family material is one selected from a group consisting of 4,4',4"-tri (N-carbazoyl)triphenylamine (hereinafter, referred to as "TCTA"), 4,4',4"-tris(N-3-methyl phenyl-N-phenyl-amino)-triphenylamine (hereinafter, referred to as "m-MTDATA") and 1,3,5-tris-(N,N-bis-(4-methoxy-phenyl)-aminophenyl)-benzene (hereinafter, referred to as "TDAPB").

In the hole injecting layer 120, preferably, though not necessarily, the host material is at least one material selected from a group consisting of an aryl amine family and a starburst family, which consist of a low molecular material. Preferably, though not necessarily, the aryl amine family material is α-NPB, and the starburst family material is one selected from a group consisting of TCTA, m-MTDATA, and TDAPB. Further, in the case that the host material of the hole injecting layer 120 is comprised of a high molecular material, the host material is at least one material selected from a TPD based polymer, poly-poly(styrene sulfonic acid) (hereinafter, referred to as "PEDOT-PSS") (obtained from Bayer AG), and so forth. The TPD based polymer may be BFE (obtained from Dow Chemical Company).

When the host materials of the hole injecting layer 120 and/or the hole transporting layer 130 consist of a high molecular material, the hole injecting layer 120 and/or the hole transporting layer 130, which are doped by the electron acceptor, are formed by blending the host material of the hole injecting layer 120 or the hole transporting layer 130 with the electron acceptor, and by coating and heat-treating the blended material at a thickness of hundreds of angstroms.

However, when the host materials of the hole injecting layer 120 and/or the hole transporting layer 130 consist of a low molecular material, the hole injecting layer 120 and/or the hole transporting layer 130, which are doped by the electron acceptor, are formed by vapor-depositing the host material of the hole injecting layer 120 or the hole transporting layer 130 with the electron acceptor at a thickness of hundreds of angstroms.

Preferably, though not necessarily, the electron acceptor has 0.01 to 50 wt % among the gross weight of the doped layer, i.e., the hole injecting layer 120 or the hole transporting layer 130. In the case that the electron acceptor exceeds 50 wt %, a leakage current is problematic. More preferably, though again not necessarily, the electron acceptor is used within a range from 0.01 to 10 wt % among the gross weight of the doped layer. Further, the electron acceptor of the doped layer is preferably, though not necessarily, formed to have a gradient of concentration in such a manner that the concentration is decreased toward an emission layer, which will be formed in the subsequent process.

Then, the emission layer 140 is formed on the hole transporting layer 130. Without the hole transporting layer 130, the emission layer 140 may be formed on the hole injecting layer 120. The emission layer 140 may be formed using a fluorescent or phosphorescent material. In the case of a full color organic light-emitting device, red, green, and blue emission layers are formed respectively, in which each emission layer may be formed using the typical patterning technique, for example, the vacuum deposition technique using a shadow mask, the laser induced thermal image (LITI) technique, or so forth.

Subsequently, a cathode 180 is formed on the emission layer 140. The cathode 180 may be formed of a transparent or reflective electrode. Preferably, though not necessarily, before the cathode 180 is formed, at least one selected from a group consisting of a hole blocking layer 150, an electron transporting layer 160, and an electron injecting layer 170 is further formed on the emission layer 140.

Alternatively, a cathode may be formed on a substrate, and then an emission layer may be formed on the cathode. Subsequently, a hole injecting layer and/or a hole transporting layer, which are doped with an electron acceptor as mentioned above, are formed on the emission layer, and finally an anode is formed on the hole injecting layer or the hole transporting layer, so that the organic light-emitting device having an inverted structure can be fabricated. Preferably, though not necessarily, before the emission layer is formed, at least one selected from a group consisting of a hole blocking layer, an electron transporting layer, and an electron injecting layer may be further formed on the cathode.

Thereby, the organic light-emitting device having the doped hole transporting layer and/or the doped hole injecting layer is fabricated.

This organic light-emitting device is driven by applying a voltage to the anode 110 and the cathode 180, wherein the hole injecting layer 120 facilitates to inject the holes from the anode 110 into the emission layer 140, while the hole transporting layer 130 facilitates to transport the holes from the anode 110 toward the emission layer 140. The holes within the hole injecting layer 120 and hole transporting layer 130 are transported to a layer adjacent to them by a hopping process.

As mentioned above, the hole injecting layer 120 and/or the hole transporting layer 130 are formed to have the host and dopant materials, in which the dopant material functions as an electron acceptor having an electron affinity greater than that of the host material by 0.1 eV or more, while the host material generally functions as an electron donor. Thus, when the organic light-emitting-device is driven, the electron acceptor and donor are combined with each other to form a donor-acceptor pair, i.e., a charge transfer complex. Here, the electron donor, that is, the host material contained in the charge transfer complex, cannot take part in the hopping process to transfer the holes. As a result, hole mobility within the doped layer may be reduced. Therefore, by decreasing a quantity of holes injected into the emission layer 140, the quantity of holes injected into the emission layer 140 can be balanced with that of the electrons injected into the emission layer 140. Thereby, a luminous efficiency of the organic light-emitting device can be increased.

Hereinafter, several examples are presented to help understand the present invention. It should be noted that the following examples are merely given to help understand the present invention, but not to limit the present invention.

The following examples 1 to 2 discuss fabricating the organic light-emitting device in order to look into the luminous efficiency of the organic light-emitting device according to embodiments of the present invention.

Example 1

An anode was formed on a substrate using an ITO (Indium Tin Oxide). The substrate on which the ITO had been formed was subjected to cleaning, UV-$O_3$ treating for 15 minutes, coating with a blended solution of BFE (obtained from Dow Chemical Company) with 5 wt % of 9,10-dicyanoanthracene (hereinafter, referred to as "DCA") at a proper spin speed and at a thickness of 30 nm, and heat treating, and thus a hole injecting layer was formed. The electron affinity was 2.46 eV for the BFE, and 3.2 eV for the DCA.

A hole transporting layer, an emission layer, a hole blocking layer, an electron transporting layer, an electron injecting layer, and a cathode were sequentially deposited on the substrate on which the hole injecting layer had been formed, and the substrate was sealed using a moisture absorbent and a glass cover.

30 nm of IDE320 (obtained from IDEMITSU COMPANY) was used for the hole transporting layer, and 20 nm of IDE140 (obtained from IDEMITSU COMPANY) containing 6 wt % of IDE105 was used for the emission layer. The IDE105 is blue material. 5 nm of bis(2-methyl-8-quinolinolato)-(4-phenyl-phenolato)-aluminum (hereinafter, referred to as "BAlq") was used for the hole blocking layer, 20 nm of aluminum tris(8-hydroxyquinoline) (hereinafter, referred to as "$Alq_3$") was used for the electron transporting layer, 0.5 nm of LiF was used for the electron injecting layer, and 300 nm of Al was used for the cathode. To be brief, the organic light-emitting device was formed to have a structure of anode (ITO)/hole injecting layer (BFE+5 wt % of DCA, 30 nm)/hole transporting layer (IDE320, 30 nm)/emission layer (IDE140+6 wt % of IDE105, 20 nm)/hole blocking layer (BAlq, 5 nm)/electron transporting layer ($Alq_3$, 20 nm)/electron injecting layer (LiF, 0.5 nm)/cathode (Al, 300 nm).

Example 2

The organic light-emitting device was fabricated by the same method as Example 1, except that the hole transporting layer had not been formed.

Comparison 1

The organic light-emitting device was fabricated by the same method as Example 1, except that the hole injecting layer had been formed using BFE which was not blended with DCA.

Comparison 2

The organic light-emitting device was fabricated by the same method as Example 1, except that the hole injecting layer had been formed using BFE which was not blended with DCA, and that the hole transporting layer had not been formed.

For the organic light-emitting devices fabricated according to Examples 1 and 2 as well as Comparisons 1 and 2, a driving voltage, a current density, and a luminous efficiency were measured respectively. The measured results are given in Table 1. The driving voltage and luminous efficiency were measured at a luminance of 200 nit, and the current density was measured at a voltage of 6 V.

TABLE 1

| items | HIL | HTL | driving voltage (V, @ 200 nit) | current density (mA/cm$^2$, @ 6 V) | luminous efficiency (Cd/A, @ 200 nit) |
|---|---|---|---|---|---|
| Example 1 | BFE + 5 wt % DCA 30 nm | IDE320 30 nm | 8.7 | 0.098 | 8.1 |
| Example 2 | BFE + 5 wt % DCA 30 nm | — | 6.4 | 2.576 | 5.6 |
| Comparison 1 | BFE 30 nm | IDE320 30 nm | 5.3 | 7.13 | 6.66 |
| Comparison 2 | BFE 30 nm | — | 4.7 | 24.4 | 4.7 |

Comparing Examples 1 and 2 with Comparisons 1 and 2 with reference to Table 1, it can be seen that the case (Example 1 or 2) of forming the hole injecting layer using a blended solution of BFE and 5 wt % of DCA has an increased luminous efficiency by 20%, but has an increased driving voltage and a decreased current density, as compared with the case (Comparison 1 or 2) of forming the hole injecting layer using BFE which is not blended with DCA.

It was determined that the increase of the driving voltage and the decrease of the current density result from the fact that the DCA doped into the hole injecting layer functions as a trap of the holes, and therefore decreases hole mobility (increase of the driving voltage). In other words, because the DCA of electron acceptor and the BFE of electron donor are combined with each other to form a donor-acceptor pair, i.e., a charge transfer complex, and the BFE contained in the charge transfer complex cannot take part in the hopping process to transfer the holes, the increase of the driving voltage and the decrease of the current density can occur. This can force a quantity of holes injected into the emission layer to be similar to a quantity of electrons injected into the emission layer, so that a region of recombining the electrons and the holes is limited to the emission layer (increase of the luminous efficiency).

The following Example 3 discusses fabricating the organic light-emitting device in order to see how much the lifetime of the organic light-emitting device according to an embodiment of the present invention is increased.

Example 3

The organic light-emitting device was fabricated by the same method as Example 1, except that the blended solution of BFE with 5 wt % of DCA was coated at a thickness of 25 nm on the substrate, on which ITO had been formed, to form the hole injecting layer, and then the hole transporting layer having a thickness of 25 nm was formed on the hole injecting layer using IDE320.

Comparison 3

The organic light-emitting device was fabricated by the same method as Example 1, except that the BFE was not blended with DCA, and was coated at a thickness of 25 nm on the substrate, on which ITO had been formed, to form the hole injecting layer, and then the hole transporting layer having a thickness of 25 nm was formed on the hole injecting layer using IDE320.

Figure 2:
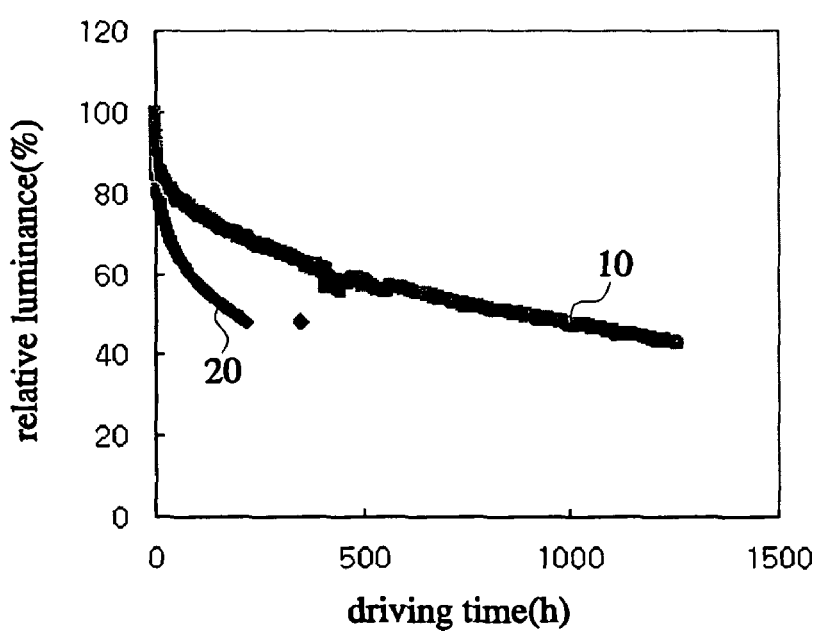
FIG. 2 is a graph illustrating relative luminance to driving time in an organic light-emitting device fabricated according to Example 3 and Comparison 3 of the present invention.

For the organic light-emitting devices fabricated according to Example 3 and Comparison 3, a driving voltage, luminous efficiency and a half-lifetime were each measured. The measured results are given in Table 2. Further, a relative luminance to driving time is shown in FIG. 2. The driving voltage and luminous efficiency were measured at a luminance of 200 nit, and the half-lifetime measures the time taken to fall down from an initial luminance of 1000 nit to 500 nit.

TABLE 2

| items | HIL | HTL | driving voltage (V, @ 200 nit) | luminous efficiency (Cd/A, @ 200 nit) | Half-lifetime (hour) |
|---|---|---|---|---|---|
| Example 3 | BFE + 5 wt % DCA 25 nm | IDE320 25 nm | 6.4 | 7.0 | 900 |
| Comparison 3 | BFE 25 nm | IDE320 25 nm | 5.6 | 5.38 | 190 |

Comparing Example 3 with Comparison 3 with reference to Table 2, the case (Example 3) of forming the hole injecting layer using a blended solution of BFE and 5 wt % of DCA has an increased luminous efficiency, and an increased half-lifetime by 100% or more, but has an increased driving voltage, as compared with the case (Comparison 3) of forming the hole injecting layer using BFE which is not blended with DCA. This fact can be confirmed through FIG. 2. Referring to FIG. 2, it can be seen that Example 3 (indicated by reference numeral 10) has a half-lifetime longer than that of Comparison 3 (indicated by reference numeral 20) when the relative luminance is decreased from 100% to 50%. In this manner, in Example 3, despite the increase of the driving voltage, the increase of the luminous efficiency and the decrease of the half-lifetime were determined to result from the fact that DCA doped into the hole injecting layer functions as a trap of the holes, and therefore decreases hole mobility (increase of the driving voltage). This forces a quantity of the holes injected into the emission layer to be similar to that of the electrons injected into the emission layer, so that a region of recombining the electrons and the holes is limited to the emission layer (increase of the luminous efficiency), and at the same time, accumulation of the holes is inhibited at the interface between the emission layer and the hole injecting layer or the hole transporting layer (increase of the half-lifetime).

As can be seen from the foregoing, according to the present invention, the electron acceptor is doped into the hole injecting layer and/or the hole transporting layer, wherein the electron acceptor has the electron affinity greater than that of the host material of the doped layer (hole injecting layer or hole transporting layer) by 0.1 eV or more. As a result, it is possible to increase the luminous efficiency as well as the lifetime of the organic light-emitting device.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An organic light-emitting device comprising:
    an anode;
    a cathode;
    an emission layer interposed between the anode and the cathode; and
    a hole injecting layer interposed between the anode and the emission layer;
    wherein the hole injecting layer comprises:
        a host material to function as an electron donor, and
        a dopant material to function as an electron acceptor;
    wherein the dopant material has an electron affinity greater than that of the host material by at least 0.1 eV; and
    wherein a concentration of the electron acceptor doped into the hole injecting layer decreases with a decreasing distance from the emission layer.

2. The organic light-emitting device according to claim 1, wherein the electron acceptor comprises at least one functional group selected from a group consisting of a nitro group ($-NO_2$), a cyano group ($-CN$), a sulfonyl group ($-SO_2$), a sulfoxide group ($-SO_3$), a carbonyl group ($-CO$), a carboxyl group ($-CO_2$), an ester group ($-COO$), an anhydride group, an imide group, an imine group, a halogen group, a fluoroalkyl group, and a fluoroaromatic group.

3. The organic light-emitting device according to claim 1, wherein the electron acceptor is one selected from a group consisting of an aromatic family, an olefin family, an aromatic-olefin conjugate family, an aromatic-aromatic conjugate family, a fused aromatic family, and a heterocyclic compound family.

4. The organic light-emitting device according to claim 1, wherein the electron acceptor constitutes 0.01 to 50 wt % of the hole injecting layer.

5. The organic light-emitting device according to claim 4, wherein the electron acceptor constitutes 0.01 to 10 wt % of the hole injecting layer.

6. The organic light-emitting device according to claim 1, further comprising at least one layer selected from a group consisting of a hole blocking layer, an electron transporting layer, and an electron injecting layer;
    wherein the at least one layer selected from the group is interposed between the emission layer and the cathode.

7. The organic light-emitting device according to claim 1, wherein the hole injecting layer is formed using a solution process or a vacuum deposition technique.

8. The organic light-emitting device according to claim 1, wherein the host material of the hole injecting layer comprises at least one low molecular material selected from a group consisting of an aryl amine family and a starburst family.

9. The organic light-emitting device according to claim 1, wherein the host material of the hole injecting layer comprises N,N'-bis(naphthalen-1-yl)-N,N'-bis(phenyl)benzidine.

10. The organic light-emitting device according to claim 1, wherein the host material of the hole injecting layer comprises one selected from a group consisting of 4,4',4"-tri(N-carbazoyl)triphenylamine, 4,4',4"-tris(N-3-methyl phenyl-N-phenyl-amino)-triphenylamine, and 1,3,5-tris-(N,N-bis-(4-methoxy-phenyl)-aminophenyl)-benzene.

11. The organic light-emitting device according to claim 1, wherein the hole injecting layer is formed by vapor-depositing the host material with the electron acceptor at a thickness of hundreds of angstroms.

12. The organic light-emitting device according to claim 1, wherein the host material of the hole injecting layer comprises at least one high molecular material selected from a group consisting of a TPD based polymer and poly-poly(styrene sulfonic acid).

13. The organic light-emitting device according to claim 12, wherein the hole injecting layer is formed by blending the host material with the electron acceptor to obtain a blended material, and coating and heat-treating the blended material at a thickness of hundreds of angstroms.

14. The organic light-emitting device according to claim 1, further comprising a hole transporting layer interposed between the hole injecting layer and the emission layer.

15. The organic light-emitting device according to claim 14, wherein the hole transporting layer is not doped with an electron acceptor.

16. The organic light-emitting device according to claim 14, wherein the hole transporting layer comprises:
    a host material to function as an electron donor; and
    a dopant material to function as an electron acceptor; and
    wherein the dopant material of the hole transporting layer has an electron affinity greater than that of the host material of the hole transporting layer by at least 0.1 eV.

17. The organic light-emitting device according to claim 16, wherein the host material of the hole transporting layer comprises BFE.

18. An organic light-emitting device comprising:
    an anode;
    a cathode;
    an emission layer interposed between the anode and the cathode; and
    a hole injecting layer interposed between the anode and the emission layer;
    wherein the hole injecting layer comprises:
        a host material to function as an electron donor, and
        a dopant material to function as an electron acceptor;
    wherein the dopant material has an electron affinity greater than that of the host material by at least 0.1 eV; and
    wherein the electron acceptor is one selected from a group consisting of 4-nitroaniline, 4-nitrobiphenyl, 4-dimethylamino-4'-nitrostilbene, 1,4-dicyanobenzene, 9,10-dicyanoanthracene, 1,2,4,5-tetracyanobenzene, 3,4,9,10-perylenetetracarboxylic dianhydride, N,N'-bis(2,5-di-t-buytlphenyl)-3,4,9,10-perylenedicarboxylmide, tetrachlorophthalic anhydride, tetrachlorophthalonitrile, anthraquinone, phenanthrenequinone, 1,10-phenanthroline-5,6-dione, phenazine, quinoxaline, and 2,3,6,7-tetrachloroquinoxaline.

19. An organic light-emitting device comprising:
    an anode;
    a cathode;
    an emission layer interposed between the anode and the cathode; and
    a hole injecting layer interposed between the anode and the emission layer;
    wherein the hole injecting layer comprises:
        a host material to function as an electron donor, and
        a dopant material to function as an electron acceptor;
    wherein the dopant material has an electron affinity greater than that of the host material by at least 0.1 eV; and
    wherein the electron acceptor is 9,10-dicyanoanthracene.

20. An organic light-emitting device comprising:
    an anode;

a cathode;
an emission layer interposed between the anode and the cathode; and
at least one of a hole injecting layer and a hole transporting layer interposed between the anode and the emission layer;
wherein the at least one of the hole injecting layer and the hole transporting layer comprises:
  a host material to function as an electron donor; and
  a dopant material to function as an electron acceptor;
wherein the electron donor and the electron acceptor are combined to form an electron donor-acceptor, pair,
wherein the dopant material has an electron affinity greater than that of the host material by at least 0.1 eV; and
wherein only the hole injection layer is doped with the electron acceptor, and the hole transporting layer is not doped with the electron acceptor and a concentration of the electron acceptor doped into the hole injecting layer decreases with a decreasing distance from the emission layer.

21. An organic light-emitting device comprising:
an anode;
a cathode;
an emission layer interposed between the anode and the cathode; and
at least one of a hole injecting layer and a hole transporting layer interposed between the anode and the emission layer;
wherein the at least one of the hole injecting layer and the hole transporting layer comprises:
  a host material to function as an electron donor; and
  a dopant material to function as an electron acceptor;
wherein the dopant material has an electron affinity greater than that of the host material by at least 0.1 eV; and
wherein a concentration of the electron acceptor doped into the at least one of the hole injecting layer and the hole transporting layer decreases with a decreasing distance from the emission layer.

22. An organic light-emitting device comprising:
an anode;
a cathode;
an emission layer interposed between the anode and the cathode; and
a hole injecting layer interposed between the anode and the emission layer;
wherein the hole injecting layer comprises:
  a host material to function as an electron donor, and
  a dopant material to function as an electron acceptor;
wherein the dopant material has an electron affinity greater than that of the host material by at least 0.1 eV; and
wherein the host material of the hole injecting layer comprises BFE.

23. An organic light-emitting device comprising:
an anode;
a cathode;
an emission layer interposed between the anode and the cathode;
a hole injecting layer interposed between the anode and the emission layer; and
a hole transporting layer interposed between the hole injecting layer and the emission layer;
wherein the hole injecting layer comprises:
  a host material to function as an electron donor, and
  a dopant material to function as an electron acceptor;
wherein the dopant material of the hole injecting layer has an electron affinity greater than that of the host material of the hole injecting layer by at least 0.1 eV;
wherein the hole transporting layer comprises:
  a host material to function as an electron donor; and
  a dopant material to function as an electron acceptor;
wherein the dopant material of the hole transporting layer has an electron affinity greater than that of the host material of the hole transporting layer by at least 0.1 eV; and
wherein a concentration of the electron acceptor doped into the hole transporting layer decreases with a decreasing distance from the emission layer.

24. An organic light-emitting device comprising:
an anode;
a cathode;
an emission layer interposed between the anode and the cathode;
a hole injecting layer interposed between the anode and the emission layer; and
a hole transporting layer interposed between the hole injecting layer and the emission layer;
wherein the hole injecting layer comprises:
  a host material to function as an electron donor, and
  a dopant material to function as an electron acceptor;
wherein the dopant material of the hole injecting layer has an electron affinity greater than that of the host material of the hole injecting layer by at least 0.1 eV;
wherein the hole transporting layer comprises:
  a host material to function as an electron donor; and
  a dopant material to function as an electron acceptor;
wherein the dopant material of the hole transporting layer has an electron affinity greater than that of the host material of the hole transporting layer by at least 0.1 eV; and
wherein the electron acceptor doped into the hole transporting layer is 9,10-dicyanoanthracene.

* * * * *

UNITED STATES PATENT AND TRADEMARK OFFICE
CERTIFICATE OF CORRECTION

| | | |
|---|---|---|
| PATENT NO. | : 7,771,843 B2 | |
| APPLICATION NO. | : 10/839338 | |
| DATED | : August 10, 2010 | |
| INVENTOR(S) | : Min Chul Suh et al. | |

It is certified that error appears in the above-identified patent and that said Letters Patent is hereby corrected as shown below:

Column 10, line 48, "-perylenedicarboxylmide-" should be --perylenedicarboxyimide,--.

Column 11, line 12, delete "," after "donor-acceptor".

Signed and Sealed this
Twenty-eighth Day of December, 2010

David J. Kappos
*Director of the United States Patent and Trademark Office*